(12) United States Patent
Schulze

(10) Patent No.: US 7,491,629 B2
(45) Date of Patent: Feb. 17, 2009

(54) METHOD FOR PRODUCING AN N-DOPED FIELD STOP ZONE IN A SEMICONDUCTOR BODY AND SEMICONDUCTOR COMPONENT HAVING A FIELD STOP ZONE

(75) Inventor: Hans-Joachim Schulze, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 482 days.

(21) Appl. No.: 11/201,879

(22) Filed: Aug. 11, 2005

(65) Prior Publication Data

US 2006/0035436 A1 Feb. 16, 2006

(30) Foreign Application Priority Data

Aug. 12, 2004 (DE) .................. 10 2004 039 209

(51) Int. Cl.
*H01L 21/04* (2006.01)
(52) U.S. Cl. .................. 438/510; 257/E21.145
(58) Field of Classification Search ............. 438/510; 257/E21.145
See application file for complete search history.

(56) References Cited

U.S. PATENT DOCUMENTS 4,211,587 A * 7/1980 Massies et al. ............. 438/572
5,326,993 A 7/1994 Iwamuro
2006/0030126 A1 * 2/2006 Mauder et al. ............. 438/460

FOREIGN PATENT DOCUMENTS

| DE | 198 29 614 | 1/2000 |
|----|------------|--------|
| DE | 100 53 445 | 5/2002 |
| DE | 102 43 758 | 4/2004 |
| DE | 102 45 091 | 4/2004 |
| EP | 0 746 040  | 12/1996 |
| EP | 1 097 481  | 3/2004 |
| WO | 01/86712   | 11/2001 |

OTHER PUBLICATIONS

Akio Nakagawa, et al. MOSFET-mode Ultra-Thin Wafer PTIGBTs for Soft Switching Application (4 pgs.), 2004.

* cited by examiner

*Primary Examiner*—Bradley K Smith
(74) *Attorney, Agent, or Firm*—Dicke, Billig & Czaja, PLLC

(57) ABSTRACT

A method for producing an n-doped field stop zone in a semiconductor body. The method includes carrying out a diffusion process for the indiffusion of sulfur, hydrogen or selenium proceeding from one side into the semiconductor body in order to produce a first n-doped semiconductor zone. A second n-doped semiconductor zone is produced in the first semiconductor zone, which is doped more highly than the first semiconductor zone. Additionally, a semiconductor component having a field stop zone is disclosed.

12 Claims, 4 Drawing Sheets c)

METHOD FOR PRODUCING AN N-DOPED FIELD STOP ZONE IN A SEMICONDUCTOR BODY AND SEMICONDUCTOR COMPONENT HAVING A FIELD STOP ZONE

CROSS-REFERENCE TO RELATED APPLICATIONS

This Utility Patent Application claims priority to German Patent Application No. DE 10 2004 039 209.9-33, filed on Aug. 12, 2004, which is incorporated herein by reference.

FIELD OF THE INVENTION

The present invention relates to a method for producing an n-doped field stop zone in a semiconductor body, and a semiconductor component.

BACKGROUND

The overall power loss of power IGBTs that occurs during operation can be reduced by providing an n-doped field stop zone which is doped more highly than the n-type base and precedes the p-type emitter or collector. Such field stop zones preceding the p-type emitter and of the same conduction type as the n-type base, which are also referred to as buffer zones, are employed particularly in so-called PT-IGBTs (PT=punch through) and serve for limiting the electric field in order to prevent the electric field from punching through to the p-type emitter.

Nakagawa, A. et al: "MOSFET-mode Ultra-Thin Wafer PTIGBT for Soft Switching Application—Theory and Experiments", Proceedings of ISPSD 2004 (Kitakyushu, Japan), pages 437-440, describes a so-called SPT-IGBT (SPT = soft punch through) with an n-type buffer zone preceding the p-type emitter.

DE 100 53 445 C2 describes a power IGBT whose p-type emitter is preceded by an n-doped field stop zone which is doped more highly than the n-type base and which has a more highly doped section adjoining the p-type emitter and a more weakly doped section adjoining the more highly doped section.

For the production of power semiconductor components in thin wafer technology, it is known firstly to provide a semiconductor wafer—from which the individual chips are later sawn out—the thickness of which is greater than the desired thickness of the later components, and to reduce the thickness of, i.e. to thin, the wafer in the course of the production method. In this case, it is desirable to carry out as many process steps as possible—for example including the process steps for producing such a field stop zone—prior to the thinning in order that the wafer, which is less stable mechanically after the thinning, is thermally or mechanically loaded as little as possible.

A semiconductor body can be thinned in a known manner by grinding thin the semiconductor body, by grinding thin and subsequently etching the semiconductor body, or just by etching the semiconductor body.

One possibility for realizing such an n-doped semiconductor zone is customarily the indiffusion of phosphorus into the semiconductor body. However, this method has the disadvantage that, on account of the low diffusion constant of phosphorus, diffusion processes with extremely long diffusion durations at very high temperatures have to be carried out in order to achieve high penetration depths such as are required for the production of a field stop zone prior to thinning the wafer. The diffusion duration for the production of an n-doped zone with a penetration depth of approximately 200 μm is several weeks at diffusion temperatures far in excess of 1200° C.

The long diffusion duration and the high diffusion temperature result in severe loading on the semiconductor body to the effect that a high oxygen concentration arises in the semiconductor body, which may be disadvantageous both with regard to an undesirable formation of so-called thermal donors and with regard to the generation of disturbing recombination and generation centers. Moreover, the gradient of the doping profile of the n-doped semiconductor zone formed by the diffusion process cannot be reduced arbitrarily since the diffusion durations that are long anyway would rise even further as a result of this.

DE 198 29 614 A1 describes a method for producing a field stop layer of an IGBT, which provides for producing the stop layer by means of a diffusion method firstly with a thickness that is greater than is electrically necessary, and for subsequently thinning the component in order to obtain the desired thickness of the stop layer.

A method for producing a buried field stop zone by means of ion implantation is described for example in 102 43 758 A1.

SUMMARY

Embodiments of the present invention provide a method for producing a semiconductor, and a semiconductor component having a field stop zone. In one embodiment, the present invention provides a method for producing an n-doped field stop zone in a semiconductor body. The method includes carrying out a diffusion process for the indiffusion of sulfur, hydrogen or selenium proceeding from one side into the semiconductor body in order to produce a first n-doped semiconductor zone. A second n-doped semiconductor zone is produced in the first semiconductor zone, which is doped more highly than the first semiconductor zone.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
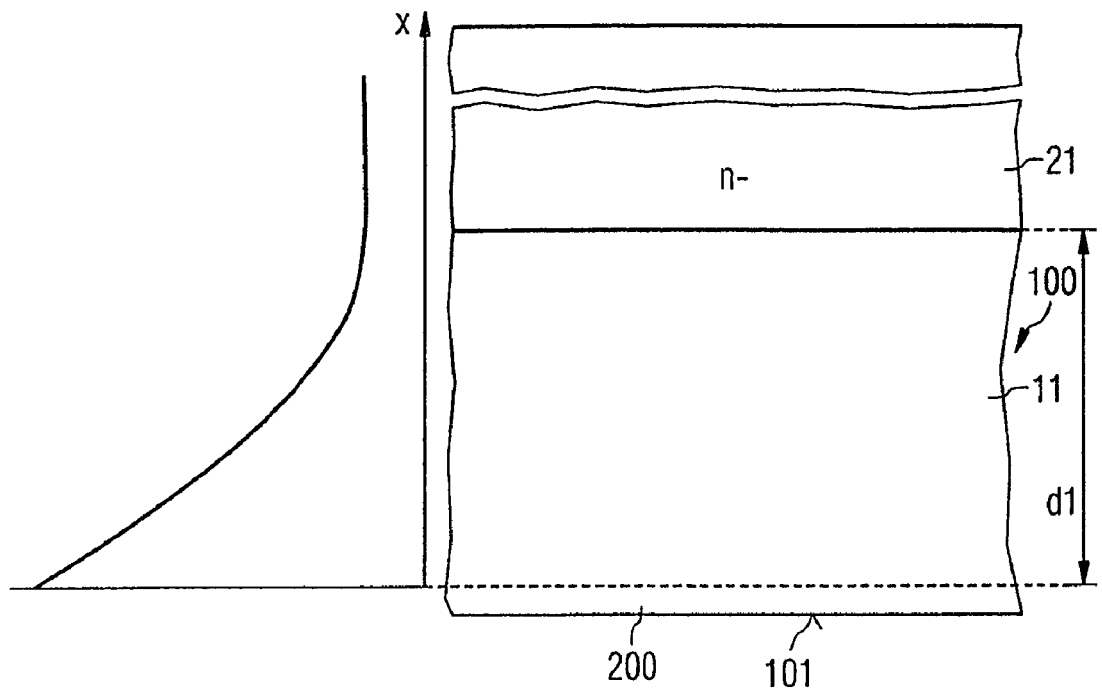
FIG. 1 illustrates one embodiment of a method according to the invention during a first process for producing an n-doped first semiconductor zone in a semiconductor body.

In the following Detailed Description, reference is made to the accompanying drawings, which form a part hereof, and in which is shown by way of illustration specific embodiments in which the invention may be practiced. In this regard, directional terminology, such as "top,""bottom,""front,""back," ""leading,""trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a method for producing a field stop zone having two sections doped to different extents, one of which has a small gradient of the doping profile, which method can be realized cost-effectively and, moreover, brings about only little loading on the semiconductor body, and to provide a semiconductor component having a field stop zone.

In one embodiment, the method according to the invention for producing an n-doped field stop zone in a semiconductor body includes carrying out a diffusion process for the indiffusion of sulfur, hydrogen or selenium proceeding from one side into the semiconductor body in order to produce a first n-doped semiconductor zone. A second n-doped semiconductor zone is produced in the first semiconductor zone, which is doped more highly than the first semiconductor zone.

The duration and the temperature during the diffusion process are dependent on the desired penetration depth of the first semiconductor zone proceeding from the one side.

Sulfur and hydrogen have a high diffusion constant and are suitable in particular for the production of deeply diffused first semiconductor zones with a penetration depth of 200 μm or more at comparatively low temperatures and diffusion time durations. A deeply diffused semiconductor zone with a penetration depth of approximately 250 μm can be obtained by sulfur indiffusion with a diffusion duration of approximately 10 hours and at a diffusion temperature of approximately 1000° C. A deeply diffused first semiconductor zone with a penetration depth of between 250 μm and 500 μm can be achieved by hydrogen indiffusion with diffusion durations of between as little as 30 minutes and 120 minutes at a diffusion temperature of approximately 400° C.

The penetration depth of the first semiconductor zone can be varied in particular by varying the diffusion duration, so that, by indiffusion of sulfur or hydrogen, it is possible to produce first semiconductor zones with penetration depths of between 30 μm and more than 300 μm with diffusion durations of significantly less than 24 hours and diffusion temperatures of approximately 1000° C. or 400° C.

The significantly lower diffusion durations and diffusion temperatures in comparison with production of n-doped semiconductor zones by means of phosphorus indiffusion bring about a substantially lower loading on the semiconductor body, in particular an influencing of the charge carrier lifetime or of the leakage current in the later component being considerably reduced.

The diffusion depth during the diffusion process for producing the first semiconductor zone may be set such that the dimensions of the first semiconductor zone correspond to the desired dimensions for this zone in the later component. In the case of production methods for components in which firstly a thicker semiconductor body or thicker semiconductor wafer is provided, which is ground back in the course of the production method to a thickness that is desired for the later components, there is the possibility of carrying out the diffusion process for the production of the first semiconductor zone before the semiconductor body is ground back or after the semiconductor body has been partially ground back. The parameters during this diffusion process are then chosen such that a deeply diffused first semiconductor zone arises, the dimensions of which in the diffusion direction are substantially larger than the dimension of the desired first semiconductor zone in the later component. In this case, the final dimensions of this n-doped zone result from the process of grinding back or thinning the semiconductor body.

The penetration depth of the first semiconductor zone that is set by the diffusion process lies between 200 μm and 300 μm, for example, before the semiconductor body is ground back and between 30 μm and 60 μm, for example, after the grinding back. If the desired removal of the semiconductor body is greater than the difference between the penetration depth of the first semiconductor zone that can be set by the diffusion process and the desired penetration depth in the later component, the semiconductor body may already be partially ground back before the diffusion process is carried out, which is possible in particular by virtue of the fact that the thermal loading on the semiconductor body or the wafer comprising a plurality of semiconductor bodies when carrying out a sulfur or hydrogen indiffusion is very low in comparison with a phosphorus diffusion, for example, which in turn permits a smaller thickness of the wafer without the latter being destroyed by the thermal process.

That section of the first semiconductor zone which remains after the production of the second semiconductor zone is intended to have a profile for the doping concentration in the diffusion direction with a small gradient. A doping profile with such a small gradient can be produced through sulfur or hydrogen indiffusion, the diffusion parameters being set such that firstly a deeply diffused region is produced, which is subsequently partially removed. In this embodiment, that section of the first semiconductor zone which remains after the removal has the desired small gradient of the doping profile.

Since hydrogen can be indiffused even at very low temperatures, a doping profile using indiffused hydrogen can also be produced after the thinning of the wafer/semiconductor wafer, the risk of the semiconductor body being destroyed by the thermal loading being relatively low. The penetration depth is set correspondingly lower when producing the doped zone on an already thinned wafer, this being effected by way of the diffusion duration, for example.

If the desired final thickness of the semiconductor wafer is large enough to withstand temperatures of approximately 1000° C. without destruction, and if there is no need for this wafer to be thinned, it is also possible to use selenium for producing a first semiconductor zone with a small gradient of the doping profile and a small penetration depth, i.e. penetration depths of between 30 μm and 60 μm, the selenium being indiffused with a diffusion duration of between 1 hour and 10 hours at a diffusion temperature of approximately 900° C. to 1000° C.

The production of the more heavily doped second semiconductor zone in the first semiconductor zone is preferably effected by proton implantation and a subsequent annealing process. This may also be carried out on the already thinned wafer since the required annealing temperature lies between 380° C. and 550° C. and the annealing duration is between one and a few hours, which is relatively noncritical even for already thinned wafers. Such a proton implantation and the subsequent annealing step give rise to hydrogen-induced or hydrogen-correlated donors that effect the n-type doping of the second semiconductor zone.

If the desired final thickness of the wafer is not too small, the more heavily doped second semiconductor zone may furthermore also be effected by implantation and activation or a slight indiffusion of phosphorus into a region of the semiconductor body near the surface. Since the penetration depth is in this case intended to be smaller than the penetration depth of the sulfur, hydrogen or selenium atoms during the preceding diffusion process, the duration of the phosphorus activation process for producing the second semiconductor zone may likewise be kept comparatively short.

The more weakly doped first semiconductor zone is preferably produced in such a way that its effective donor dose lies below the breakdown charge while the donor concentration in the more highly doped second semiconductor zone is so high that it stops the space charge zone present in the case of maximum voltage at the component.

The semiconductor component according to the invention has an n-doped field stop zone arranged in a semiconductor body, which field stop zone has a more weakly doped section and a more heavily doped section, the maximum doping concentration in the more weakly doped section preferably being between $2 \cdot 10^{13}$ cm$^{-3}$ and $5 \cdot 10^{14}$ cm$^{-3}$, and the doping concentration in the more weakly doped section decreasing proceeding from the more heavily doped section.

Nakagawa a.a.O describes for power IGBTs the effect that in the region of the n-type base of the component adjacent to the more highly doped buffer zone or field stop zone, very high field strengths can occur if the component is operated at high current densities, such as in the short-circuit case for example, or if high currents are switched. In that case, one refers to a flipping over of the electric field since the region of high field strength moves from the pn-junction between p-type base and n-type base to the region of the n-type base before the field stop zone. This flipping over of the electric field may lead to a local breakdown of the IGBT and ultimately to a destruction of the component.

This effect is reduced with the provision of a field stop zone having a more heavily doped section formed by the second semiconductor zone and having a more weakly doped further section that is formed by the first semiconductor zone and has a small gradient of the doping profile. The more weakly doped section with a small gradient enables, in regions lying further away from the heavily doped section, a partial compensation and, in the regions lying closer to the more heavily doped section, an overcompensation of the negative charges which occur in this region in the event of a flipping over of the electric field distribution. Given a relatively low doping concentration in the more weakly doped section a partial compensation may occur in the entire more weakly doped region, while overcompensation only takes place in the more heavily doped section. In both cases, this compensation in the case of the flipping over of the field distribution leads to a broadening of the field distribution, as a result of which the maximum electric field strength that occurs is significantly reduced, and as a result of which the tendency toward breakdown or toward current splitting is likewise significantly reduced.

FIG. 1 illustrates, in side view in cross section, one embodiment of a semiconductor body 100 during process of a method according to the invention for producing an n-doped field stop zone in a semiconductor body 100. During this process, sulfur, hydrogen or selenium is indiffused into the semiconductor body proceeding from one side 101 in order to produce a first n-doped semiconductor zone 11. The side 101 via which the dopant material is indiffused is either the front side or rear side of the later component, generally the rear side.

The indiffusion may be effected, for example, by means of a gas phase from outside via the one side 101. However, the dopant material may also be implanted, for example, into a layer 200 of the semiconductor body 100 near the surface in order to form a layer containing dopants, the semiconductor body subsequently being heated to a diffusion temperature for a diffusion duration, as a result of which the dopant atoms introduced into the layer indiffuse further into the semiconductor body 100. The dimensions of said layer 200 near the surface before the beginning of the diffusion operation are illustrated in dashed fashion.

The depth to which the dopant atoms indiffuse into the semiconductor body 100 during the diffusion step determines the dimension d1 of the n-doped semiconductor zone 11 in the diffusion direction, that is to say the direction perpendicular to the one side 101 in the present case. This dimension d1 is subsequently referred to as the thickness of the n-doped first semiconductor zone 11 and is dependent on the parameters during the diffusion process, in particular on the diffusion duration and the diffusion temperature. The diffusion temperatures are approximately 1000° C. for sulfur, approximately 400° C. for hydrogen and approximately 900° C.-1000° C. for selenium. The diffusion duration, which critically determines the penetration depth, lies between 1 hour and 10 hours for sulfur, between 30 minutes and 120 minutes for hydrogen, and between 1 hour and 10 hours for selenium. The edge concentration of the semiconductor zone 11 after the thermal step, i.e. the dopant concentration directly in the region of the surface of the semiconductor body 100 at the side 101, is predetermined by the implantation dose for example upon application of an implantation method for introducing the dopant atoms into a semiconductor layer near the surface.

The profile of the doping concentration in this n-doped semiconductor zone 11 is illustrated schematically in the left-hand part of FIG. 1. The thickness or maximum penetration depth d1 is approximately 250 µm for a sulfur indiffusion for a time duration of 10 hours at a temperature of 1000° C. The maximum of the doping concentration, which lies in the region of the one side 101, is approximately $3 \cdot 10^{14}$ cm$^{-3}$. This doping concentration decreases with increasing penetration depth down to the value of a basic doping of the semiconductor body 100 which is weakly n-doped in the example. In the example in accordance with FIG. 1, a region 21 adjoining the first n-doped semiconductor zone 11 has the basic doping of the semiconductor body.

For the production of power semiconductor components in thin wafer technology, firstly a semiconductor wafer is provided—from which the individual chips are later sawn out—the thickness of which is greater than the desired thickness of the later components, and to thin the wafer in the course of the production method. In this embodiment, it is desirable to carry out as many processes as possible prior to the thinning in order that the wafer, which is less stable mechanically after the thinning, is thermally or mechanically loaded as little as possible.

The method according to the invention, which provides the indiffusion of sulfur or hydrogen, makes it possible to produce, at comparatively low temperatures and with comparatively short diffusion times, n-doped first semiconductor zones having thicknesses of up to 500 µm which additionally have a low doping gradient since it is possible to keep the edge concentration relatively low during the indiffusion—for example in contrast to a phosphorus indiffusion—on account of the high diffusion constant. Field stop zones for power semiconductor components usually have a thickness of between 30 µm and 60 µm, so that the method according to the invention enables the n-doped first semiconductor zone also to be produced before the wafer is thinned. In this embodiment, firstly an n-doped zone having a thickness greater than the desired thickness is produced and the resultant n-doped zone is subsequently brought to the desired thickness by thinning, i.e. grinding and/or etching, the wafer.

However, there is also the possibility in the case of sulfur or hydrogen indiffusion, of choosing the diffusion parameters such that an n-doped first semiconductor zone having the desired thickness is achieved if thinning of the wafer is not desired or necessary. In particular, the indiffusion of selenium at diffusion temperatures of between 900° C. and 1000° C. and with diffusion durations of between 1 hour and 10 hours is suitable for producing an n-doped semiconductor zone with a shallow gradient of the doping profile and a low penetration depth, the gradient being controlled by way of the implantation dose of the selenium atoms that are implanted into the semiconductor body prior to the diffusion.

In order to produce the field stop zone, according to one embodiment of the method according to the invention, a second n-doped semiconductor zone is produced in the first n-doped semiconductor zone 11 produced in the manner explained, the second semiconductor zone being doped more highly than the first n-doped semiconductor zone. One method for producing such a more heavily n-doped second semiconductor zone is explained in more detail below with reference to FIGS. 2 and 3.

Figure 2:
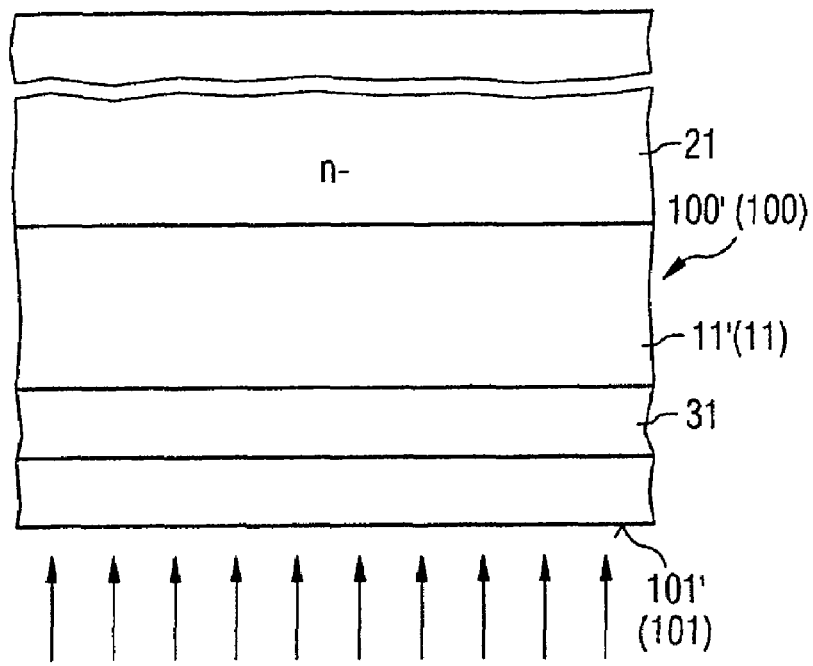
FIG. 2 illustrates the method according to the invention during further processing for producing a second n-doped semiconductor zone in the semiconductor body in accordance with a first exemplary embodiment.
Figure 2:
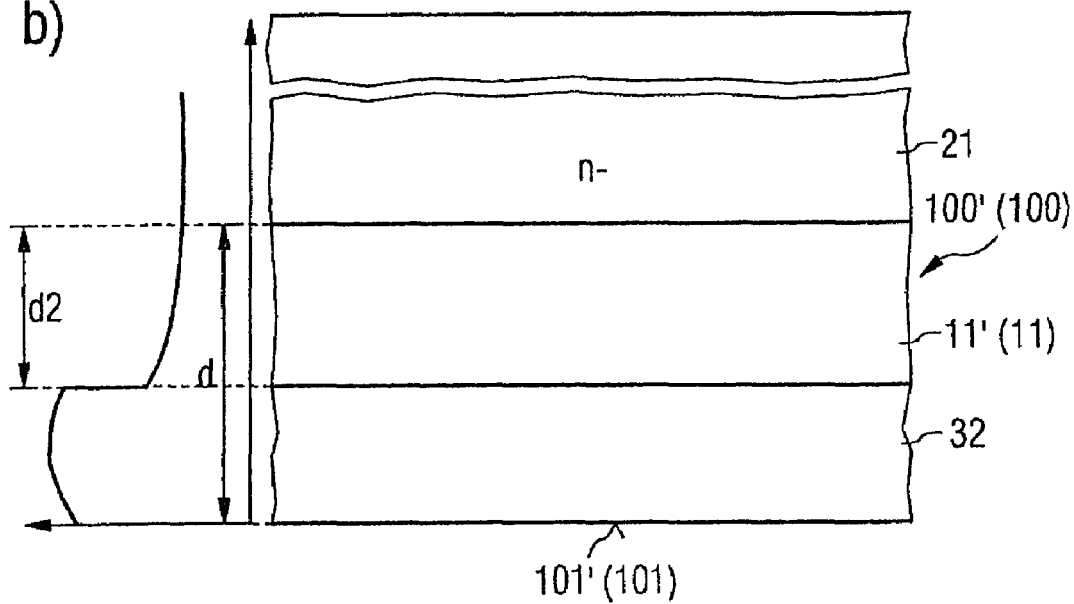
Figure 2:
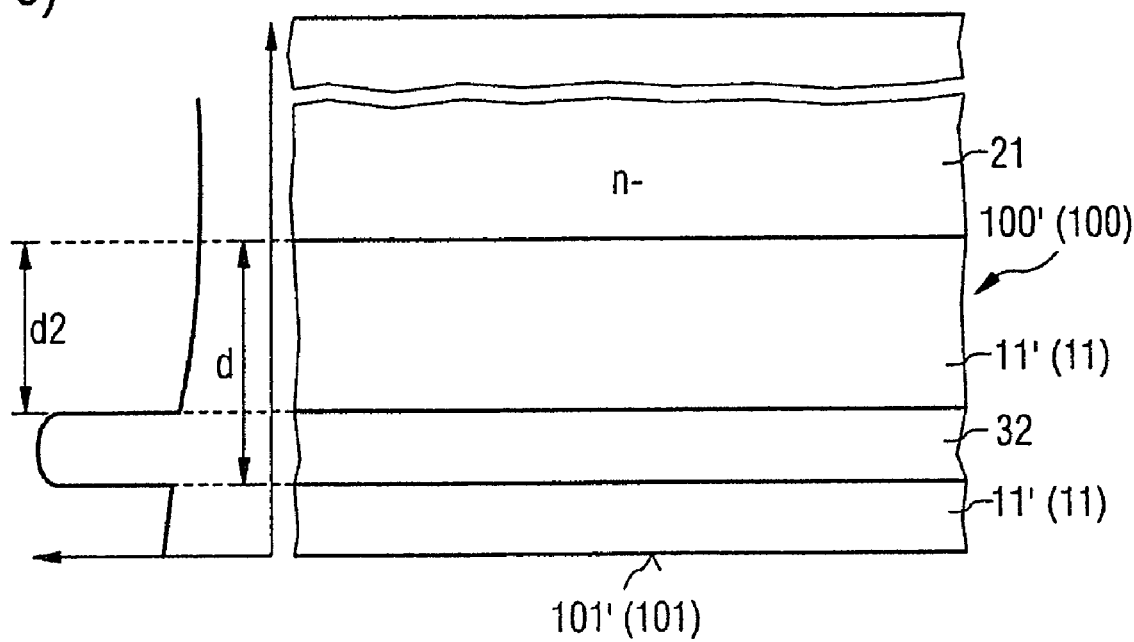
Figure 3:
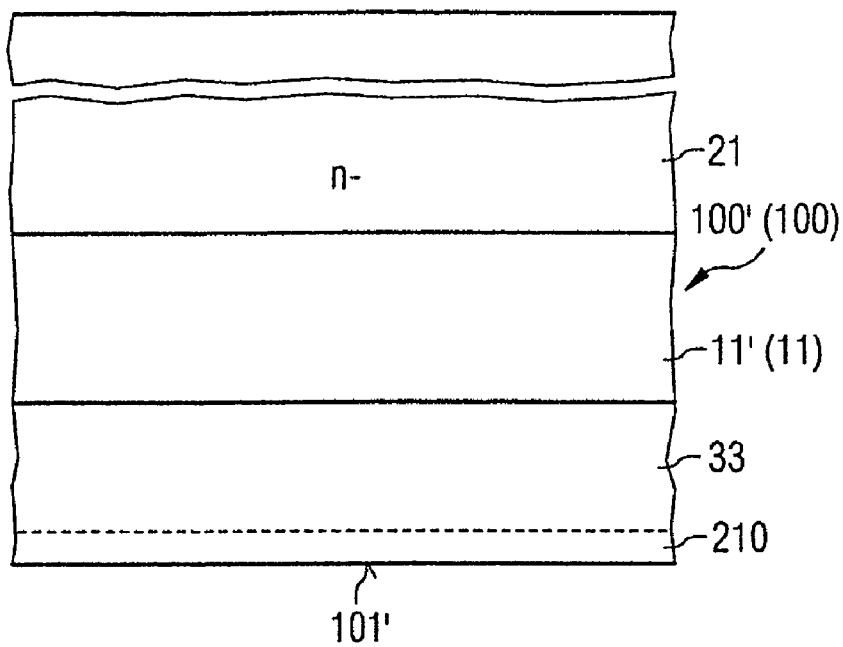
FIG. 3 illustrates the method according to the invention during further processing for producing a second n-doped semiconductor zone in the semiconductor body in accordance with a second exemplary embodiment.

If thinning of the semiconductor body 100 is necessary, this thinning is effected before the production of said more highly doped second semiconductor zone. The process for producing the second semiconductor zone are identical irrespective of whether the semiconductor body 100 is thinned beforehand. A thinned semiconductor body is assumed for the explanation below. In FIGS. 2 and 3, 100' designates the thinned semiconductor body, 11' designates the section of the first semiconductor zone 11 that remains after the thinning, and 101' designates the side of the semiconductor body that is uncovered after the thinning. FIGS. 2 and 3 indicate the reference symbols in brackets for the case where the semiconductor body is not thinned before the production of the second n-doped semiconductor layer.

In the embodiment of the method for producing a more heavily n-doped second semiconductor zone 32 in the remaining section of the first semiconductor zone 11' as explained with reference to FIG. 2, a first process (FIG. 2*a*) involves implanting protons for example having a dose of $1 \cdot 10^{14}$ cm$^{-3}$ to $2 \cdot 10^{15}$ cm$^{-3}$ into the semiconductor body 100' via the one side 101' in order to produce defects in a region 31 within the first semiconductor zone 11'. This proton implantation is subsequently followed by an annealing step during which the semiconductor body is heated to a predetermined temperature e.g. between 380° C. and 550° C., for a predetermined time duration e.g. between 1 and 4 hours, as a result of which the defects are at least partially annealed and hydrogen-induced or hydrogen-correlated donors arise which form the more highly n-doped region 32. The doping concentration profile of this region in the implantation direction, i.e. essentially perpendicular to the wafer surface, essentially follows the distribution of the defects caused by the proton implantation and is furthermore dependent on the temperature and the duration of the annealing process.

In the example in accordance with FIG. 2*b*, the more heavily doped region 32 extends as far as the rear side 101'. This can be achieved after the proton implantation by choosing high annealing temperatures in the region of up to 550° C. with annealing durations of more than 1 hour. As a result of the high annealing temperatures and long annealing durations, the highly doped zone is widened and finally extends as far as the rear side. The maximum of the doping of the more heavily doped region lies at a distance from the rear side 101' in the region of the so-called end-of-range of the irradiation and is essentially dependent on the implantation energy with which the protons are implanted. In this regard, reference is made in particular to DE 102 43 758 A1 already mentioned above.

At lower annealing temperatures, for example at temperatures of between 380° C. and 400° C., and with shorter annealing durations, for example of a maximum of 1 hour, a more highly doped region 32 is formed, whose region of maximum doping concentration likewise lies in the region of the end-of-range of the proton irradiation but lies at a distance from the rear side 101'. The doping in the section between the rear side 101' and the more heavily doped region 32 results from the production of the first semiconductor zone 11'.

Whether the more highly doped zone 32 extends as far as the rear side after the proton implantation and the annealing step depends not least also on the depth to which the protons are implanted. Thus, in the case of small implantation depths, lower annealing temperatures and annealing durations then in the case of larger implantation depths already suffice to widen the highly doped zone as far as the rear side 101'.

The left-hand part of FIGS. 2*b* and 2*c* illustrates the doping profile in the more heavily n-doped second semiconductor zone 32 and in the remaining section 11' of the first semiconductor zone. As can be seen, the doping concentration in the second semiconductor region 32 is substantially higher than the doping concentration in the remaining section of the first semiconductor zone 11' which adjoins the second zone 32.

In FIGS. 2*b* and 2*c*, d designates the dimension of the field stop zone in the vertical direction of the semiconductor body 100', that is to say the direction perpendicular to the rear side 101'. The field stop zone comprises the more heavily doped section 32 and the partial section of the more weakly doped zone 11' which adjoins that side of the more heavily doped zone 32 which is remote from the rear side 101' or which adjoins the more heavily doped zone 32 in the direction of the front side. The dimension of said partial section of the more weakly doped zone 11' is designated by d2 in FIGS. 2*b* and 2*c*.

In another embodiment, a further method for producing a more heavily n-doped second semiconductor zone 33 in the more weakly n-doped first semiconductor zone 11' is illustrated in FIG. 3. In this method, proceeding from the one side 101', phosphorus atoms are introduced into the thinned semiconductor body 100' or the non-thinned semiconductor body 100 in order to produce the second semiconductor zone 33. For this purpose by way of example, phosphorus atoms are implanted into a layer 210 near the surface on the one side 101' of the semiconductor body and are subsequently activated or indiffused somewhat.

The field stop layer resulting from the method according to the invention has, referring to FIGS. 2*b* and 3, a more weakly doped section 11' with a shallow gradient of the doping profile, which is illustrated in the left-hand part of FIG. 2*b* on the basis of the profile of the doping concentration in the vertical direction of the semiconductor body 100', and a more highly doped section 32 (FIG. 2*b*) or 33 (FIG. 3) adjoining the more weakly doped section. The doping concentration in this more weakly doped region is set such that the doping in the more weakly doped semiconductor zone lies below the breakdown charge. For this purpose, the doping concentration is preferably at most $2\cdot10^{13}$ cm$^{-3}$ to $5\cdot10^{14}$ cm$^{-3}$. The doping concentration in the more weakly doped section decreases proceeding from the more heavily doped section.

The doping in the more heavily doped section 32 or 33 is chosen such that it lies above the breakdown charge in order to reliably stop an electric field during operation of the component in the more heavily doped zone 31 or 33. The electrically active donor dose present for this purpose in the more heavily doped section 32 or 33 is preferably between $1\cdot10^{12}$ cm$^{-2}$ and $5\cdot10^{14}$ cm$^{-2}$. The specifications made above with regard to the doping concentration or donor dose apply to silicon as semiconductor material.

The extent d of the field stop zone in the vertical direction of the semiconductor body is preferably between 30 µm and 100 µm, between 0.5 µm and 20 µm being allotted to the more heavily doped section 32 or 33.

Figure 4:
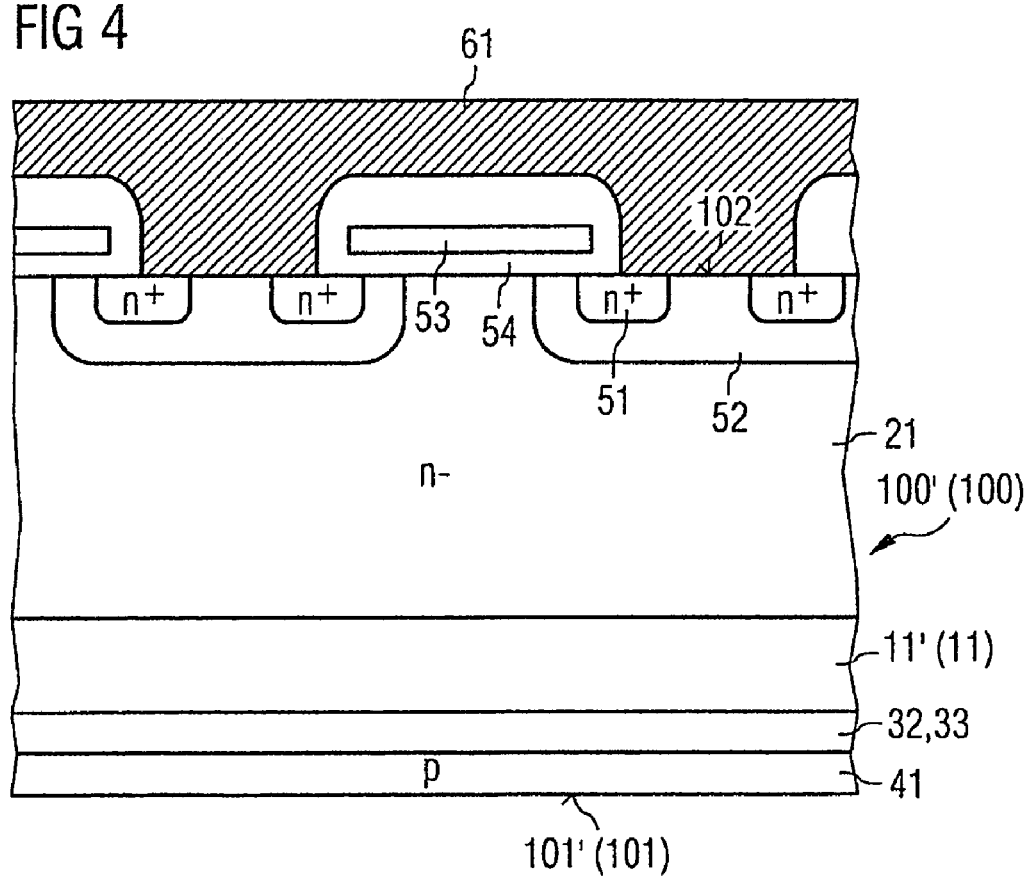
FIG. 4 illustrates, in side view in cross section, a component designed as a power IGBT and having a field stop zone produced according to the method according to the invention.

FIG. 4 illustrates, in side view in cross section, a power IGBT having a field stop zone which is produced according to the method according to the invention and has a more weakly n-doped first section 11' and a more heavily n-doped second section 32, 33. In the power IGBT the p-type emitter adjoins said field stop zone in the region of the one side 101', which is the rear side of the component in the example, said emitter being produced after the production of the field stop zone in the rear side region of the semiconductor body 100'. In order to produce said p-type emitter, by way of example, p-type dopant atoms are introduced into the semiconductor body 100' in a known manner, for example by means of an implantation. The indiffused dopant atoms of this rear-side emitter 41 may be activated for example by means of a laser annealing method. When the second n-doped semiconductor zone 33 is produced by means of phosphorus implantation (cf. FIG. 3), the activation of the dopant atoms of the rear side emitter and the activation of the n-type dopant atoms of the second semiconductor zone 33 may in this case be effected in a common method step.

The semiconductor region 21 which adjoins the more weakly doped section 11' of the field stop zone and has the basic doping of the semiconductor body forms the n-type base of the IGBT. A cell array having p-doped p-type base zones 52 and n-doped n-type emitter zones 51 is arranged in the region of a front side 102 of the semiconductor body, said front side being remote from the rear side 101'. A gate electrode 53 is arranged in a manner insulated from the semiconductor body 100' by means of an insulation layer 54 and serves, upon application of a drive potential, for forming a conductive channel in the p-type base zones 52 between the n-type emitter zones 51 and the n-type base 21 of the component.

The more weakly n-doped section 11' of this field stop zone is preferably produced in such a way that the effective donor dose in the section 11' is lower than the breakdown charge. The maximum doping concentration of this more weakly doped section of the field stop zone preferably lies between $2\cdot10^{13}$ cm$^{-3}$ and $5\cdot10^{14}$ cm$^{-3}$.

The more highly n-doped second semiconductor zone 32, 33 is produced in such a way that the doping concentration of this semiconductor zone 32, 33 is high enough to stop the space charge zone when maximum voltage is present, that is to say to prevent the space charge zone from punching through to the rear side emitter 41.

The small gradient of the profile of the doping concentration in the first semiconductor zone 11', which can be seen from the doping profile in the field stop zone illustrated in the left-hand part of FIG. 2b, counteracts the "flipping over"—described in Nakagawa loc. cit.—of the electric field at high current densities or when switching large currents and thus contributes to increasing the robustness of the component.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing an n-doped field stop zone in a semiconductor body, comprising:
   carrying out a diffusion process for the indiffusion of sulfur, hydrogen or selenium proceeding from one side into the semiconductor body to produce a first n-doped semiconductor zone; and
   producing a second n-doped semiconductor zone in the first semiconductor zone, which is doped more highly than the first semiconductor zone; and
   partially removing the semiconductor body after the diffusion process and before producing the second semiconductor zone proceeding from the one side, in order to partially remove the first semiconductor zone.

2. The method of claim 1, comprising defining the indiffused material to be sulfur and in which a diffusion duration is 1 to 20 hours at a diffusion temperature of approximately 900° C. to 1000° C.

3. The method of claim 1, comprising wherein the indiffused material is hydrogen and in which a diffusion duration is 30 minutes to 200 minutes at a diffusion temperature of approximately 400° C.

4. The method of claim 1, comprising defining the indiffused material to be selenium and in which a diffusion duration is 1 to 10 hours at a diffusion temperature of approximately 900° C. to 1000° C.

5. The method of claim 1, in which the production of the second semiconductor zone comprises:
   irradiating the semiconductor body with protons via the one side; and
   carrying out a thermal treatment in which the semiconductor body is heated to a predetermined temperature for a predetermined time duration in order to produce hydrogen-induced donors.

6. The method of claim 5, in which the irradiation is effected in such a way that a maximum of irradiation defects that are brought about by the irradiation lies at a distance of between 0.5 µm and 20 µm from the one side.

7. The method of claim 1, comprising wherein the temperature during the thermal step is between 380° C. and 550° C., and in which the duration of the thermal process is between 1 hour and 4 hours.

8. A method for producing an n-doped field stop zone in a semiconductor body, comprising:
   carrying out a diffusion process for the indiffusion of sulfur, hydrogen or selenium proceeding from one side into the semiconductor body to produce a first n-doped semiconductor zone; and
   producing a second n-doped semiconductor zone in the first semiconductor zone, which is doped more highly than the first semiconductor zone comprising producing the second n-doped semiconductor zone by means of the implantation of phosphorus via the one side.

9. The method of claim 8, comprising wherein a thermal process follows the implantation.

10. The method of claim 9, comprising wherein the semiconductor body comprises silicon.

11. A method for producing an n-doped field stop zone in a semiconductor body, comprising:
    carrying out a diffusion process for the indiffusion of sulfur proceeding from one side into the semiconductor body to produce a first n-doped semiconductor zone, in which a diffusion duration is 1 to 20 hours at a diffusion temperature of approximately 900° C. to 1000° C.; and
    producing a second n-doped semiconductor zone in the first semiconductor zone, which is doped more highly than the first semiconductor zone.

12. A method for producing an n-doped field stop zone in a semiconductor body, comprising:
    carrying out a diffusion process for the indiffusion of selenium proceeding from one side into the semiconductor body to produce a first n-doped semiconductor zone, in which a diffusion duration is 1 to 10 hours at a diffusion temperature of approximately 900° C. to 1000° C.; and
    producing a second n-doped semiconductor zone in the first semiconductor zone, which is doped more highly than the first semiconductor zone.

* * * * *